United States Patent [19]

Li Bassi et al.

[11] Patent Number: 5,168,087
[45] Date of Patent: Dec. 1, 1992

[54] AQUEOUS DISPERSE SYSTEM OF PHOTOINITIATORS AND THEIR USE

[75] Inventors: Giuseppe Li Bassi, Gavirate; Carlo Nicora, Varese, both of Italy

[73] Assignee: Fratelli Lamberti S.p.A., Albezzate, Italy

[21] Appl. No.: 489,088

[22] Filed: Mar. 6, 1990

[30] Foreign Application Priority Data

Mar. 7, 1989 [IT] Italy .................. 19676 A/89

[51] Int. Cl.$^5$ ............................................. B01J 31/00
[52] U.S. Cl. ..................... 502/164; 502/150; 502/162; 502/167; 502/168; 502/172
[58] Field of Search .............. 502/150, 162, 164, 167, 502/168, 172

[56] References Cited

U.S. PATENT DOCUMENTS

| | | | |
|---|---|---|---|
| 4,366,228 | 12/1982 | Specht et al. | 502/150 |
| 4,442,022 | 4/1984 | van der Hauw et al. | 502/150 |
| 4,533,652 | 8/1985 | Tanaka et al. | 502/150 |
| 4,576,975 | 3/1986 | Reily, Sr. | 502/167 |

*Primary Examiner*—Patrick P. Garvin
*Assistant Examiner*—E. D. Ircinski
*Attorney, Agent, or Firm*—Birch, Stewart, Kolasch & Birch

[57] ABSTRACT

The invention relates to aqueous disperse systems of photoinitiators which are particularly useful in the photopolymerization of aqueous disperse systems and emulsions of oligomers or polymers carrying photopolymerizable functionalities which are widely used in the field of dyes and packaging.

9 Claims, No Drawings

AQUEOUS DISPERSE SYSTEM OF PHOTOINITIATORS AND THEIR USE

FIELD OF THE INVENTION

The present invention relates to aqueous disperse systems of photoinitiators which are particularly useful in the photopolymerisation of aqueous systems comprising oligomers or polymers carrying photopolymerisable functionalities.

These aqueous systems, which are largely used in the field of dyes and in the coating of wrappings are normally constituted by aqueous emulsions and/or dispersions of polyurethanes, polyesters, polyethers, polyols, polyacrylates as oligomers and/or polymers carrying acrylic- and metacrylic-, fumaric-, maleic-, vinyl-ethers unsaturations.

TECHNICAL PROBLEM

The photopolymerisable systems commonly used in industry are constituted by oligomers and/or polymers carrying functionalities which can polymerise or copolymerise when they are diluted in the appropriate reactive solvents.

With the expression reactive solvents are intended monomers having low molecular weights possessing various functionalities which have a good solving power and can therefore dissolve the oligomers and maintain the systems to a degree of viscosity appropriate for their use and which, at the end of the polymerisation process, remain included in the mass as integral part of the polymeric matrix.

Unfortunately the photoinitiate polymerisation, which is a very efficient process, does not permit the complete reaction of the monomer, and therefore a tecnical problem arises that the monomer tends to migrate and be extracted from the materials which come into contact with the photopolymerised masses.

In view of the toxicity and unpleasant smell of the solvents commonly used, it is easy to understand the importance of this technical problem which entails a strong limitation on the possible use of this technology in very important fields like the coating of food-wrappings (direct or indirect) and the painting and finishing of those materials which come into contact with the users.

STATE OF THE ART

In recent times various possible solutions in alternative to the photopolymerisable systems comprising the dilution in reactive solvents have been studied.

Such solutions involve the use of oligomers or polymers carrying photopolymerisable functionalities which are dispersed or emulsifyed in water or if required, diluted with water.

With these systems it is possible to perform the photopolymerisation either immediately after the application of the liquid system or after having evaporated the water.

In the case of aqueous emulsions or dispersions wherein the dry part represents 70-80% it is necessary to evaporate the water in order to obtain the coalescence of the system before performing the photopolymerisation on the resulting homogeneous film.

Although it is necessary to add one further step to the process for preparing the final products (i.e. the water evaporation) with respect of the traditional processes, the use of aqueous systems is widely spreading because it offers the advantage of avoiding the presence of inflamables monomers in the compositions on sale and also assures the absence of residue monomers in the final products.

Anyhow, untill the present time it has not been possible to solve satisfactorily the problems derived from the use of the photoinitiators in aqueous systems.

The normally used photoinitiators cannot be easily included in systems dispersed in water. This disadvantage is particularly relevant with solids as for example: benzyl-dimethyl-ketal, benzophenone and 1-benzoyl-cyclohexanol.

Normally the problem is avoided using liquid photoinitiators which are included in the aqueous dispersions or emulsions before their use. However the possibility of using only liquid photoinitiators represents a strong limitation since users normally need a large amount of flexibility to satisfy their various demands which request the employment of various photoinitiators.

In other cases the photoinitiator is dissolved in the photopolymerisable mixture before its emulsion with water at the moment of use (autoemulsifying mixtures), but this solution involves a complicated process of production and therefore is not appreciated by the users.

In still other cases the photopolymerisable mixture is delivered to the user with the photoinitiator already included.

These mixtures, which do not require further manufacture, present the disadvantage of a limited possibility of application since it is impossible to proportion or change the photoinitiator included during the production of the mixture.

Typical examples of photoinitiators used in aqueous systems are 2-hydroxy-2-methyl-1-(p-dodecyl)propiophenone as described in the EPA-85,305, wherein the introduction of an aliphatic chain in the molecule, for lowering the melting point of the product under room temperature, results in a dilution of its active part as photoinitiator and therefore reduces its efficacity with respect to of the compound not presenting a lateral dodecyl-chain; or the 2-hydroxy-2-methyl-1-phenyl-propiophenone described in the U.S. Pat. No. 4,347,111, which is too volatile and is therefore easily lost during the coalescenceprocess by evaporation of the aqueous phase; or again the 2-hydroxy-2-methyl-1-(4-hydroxy-ethoxy-phenyl)propiophenone, as described in the PCT-WO-86/05778, which is hydrophylic up to a certain degree but is obtained through a synthetic process, which is very complicated and therefore involves higher costs than those of other commonly used photoinitiators and therefore possesses limited use.

Unfortunately, considering that the photopolymerisation process takes place in an organic-phase (after coalescence) it is not profitable to use photoinitiators which are soluble in water. These kind of photoinitiators are not very compatible with the organic matrix of the systems to photopolymerized and therefore the results are not satisfying.

DETAILED DESCRIPTION OF THE INVENTION

We have now found that it is possible to use the photoinitiators normally used in non aqueous photopolymerisable systems also for aqueous systems when such photoinitiators are used as emulsions and/or disperse systems in water.

In the present text the term "disperse systems" means both dispersion systems and emulsions.

According to a fundamental characteristic of the present invention the aqueous disperse systems of photoinitiators comprise at least a photoinitiator and at least a surface active agent.

The aqueous disperse systems of photoinitiators according to the present invention are stable, easy to proportion and introduce into mixtures of oligomers or polymers which must be polymerised and also do not interfere electrokinetically.

Such disperse systems of photoinitiators can have anionic, cationic or non-ionic characteristics according to the surface active agents used. Normally it is preferably to use non-ionic aqueous disperse systems of photoinitiators because they are more compatible with all the photopolymerisable systems dispersed in water.

The aqueous disperse systems of photoinitiators according to the present invention can contain a single photoinitiator or a mixture of them or also a couple of a photoinitiator and a hydrogen-donor (co-initiator).

Among the photoinitiators useful for the aqueous disperse systems according to the present invention are benzoin ethers, benzyldimethylketal, 2,2-dialkoxy-acetophenones, alpha-hydroxy-alkyl-aryl ketones, arylglyoxylic acid esters, mono- and di-acyl-phosphine oxides, aromatic ketones, especially benzophenone, tioxanthones, anthraquinones or the esa-aryl-bis-imidazoles.

As co-initiators can be used the compounds having a tertiary amino group with at least a hydrogen atom on the carbon atom linked to the nitrogen of the amino group.

If the above said compounds are soluble in water, as for example the N-methyl-N,N-diethanolamine (MDEA) or the triethanolamine, they can also be added to the mass to polymerise instead of being added to the aqueous dispersion of the photoinitiator without presenting negative effects on the photopolymerisation reaction. On the other hand it is preferred to add to the aqueous dispersion of the photoinitiator, and especially during its preparation, those compounds which are not soluble in water, as for example the esters of p-dimethylammino-benzoic acid.

The typical ratio in weight of photoinitiators and co-initiators in the aqueous disperse systems according to the present invention is between 1:1 and 1:2.5.

The surface active agents in the aqueous disperse systems according to the present invention have an emulsifying action, helping the wettability of the compounds to disperse in water, and also a dispersing action, preventing to reaggregation of the drops of the dispersed phase.

All the surface active agents normally available on the market can be used for the disperse systems according to the present invention, particularly suitable are the organic sulphonic acids and their salts, mono-alkyl-sulphates, quaternary ammonium salts, higher aliphatic alcohols or alkyl-phenols condensed with ethylene oxide and/or propylene, and partial esters of phosphoric acid with aliphatic alcohols and their salts.

In the preferred embodiments of the aqueous disperse systems of photoinitiators according to the present invention one or more dispersions stabilizers are added.

Such stabilizers have a thickening action and impart to the dispersion pronounced thixotropic and pseudo-elastic characteristics, with high stand viscosity and a viscosity proportionally decreasing with an increase in the mechanical stress to which the disperse system is subjected.

Among the substances having a stabilizing action useful in the aqueous disperse systems according to the present invention, are particularly preferred the polymers and the copolymers of acrylic and methacrylic acid, maleic anhydride, polyvinyl alcohol, ionic and non-ionic derivatives of cellulose and natural polysaccharides, among which particularly preferred are xanthane and its derivatives.

The quantities of the various components of the aqueous disperse systems of photoinitiators, according to the present invention, can vary within wide ranges while always maintaining their efficiency.

According to a fundamental characteristic of the present invention the photoinitiator (or the mixture of photoinitiators in the case that more then one is used) represents from 20% to 80% by weight of the disperse system and the surface active agent represents from 0.1% to 10% by weight.

In the preferred embodiments of the invention, the photoinitiator, or the mixture of photoinitiators, represents from 30% to 60% by weight and the surface active agent from 0.5% to 2% by weight of the disperse system.

When one or more stabilizers is added to the aqueous disperse system of photoinitiator, the concentration is preferably between 0.1 and 2% by weight of the aqueous disperse system.

In the above described range of concentrations, the aqueous disperse systems of photoinitiator according to the present invention are stable, either with respect to viscosity or phase separation, and can be easily stored and put on the market.

Their compatibility with the common aqueous systems of oligomers and/or polymers on the market is excellent and allows their inclusion in all the known aqueous systems.

The aqueous disperse systems of photoinitiators according to the present inventions can also include other substances, over those already mentioned, which can help in their production or prevent their deterioration as for example antifoam, degasing, antibacterial and antimold agents.

It is also possible to add to the aqueous disperse systems according to the invention all those auxiliaries which are commonly used in the aqueous systems which must be photopolymerised as thermic stabilizers, spreader, coalescence auxiliaries, pigments, photostabilizers.

The aqueous dispersions according to the present invention can be prepared according to the usual dispersing techniques, in particular by mechanical action with fast agitators or colloid mills. The inclusion of the aqueous disperse systems of photoinitiators according to the invention in the aqueous systems which must be photopolymerised is performed by mixing under mild mechanical action.

The employing ratios between the photoinitiating dispersion and the aqueous system are based on the ratios of their dry parts. Normally the quantity of photoinitiator used is between 0.5% and 10% by weight in respect of the oligomer and/or polymer contained in the system to photopolymerise.

The liquid compositions obtained after the mixing of the aqueous dispersion of photoinitiator and the aqueous system to photopolymerise are stable and can be easily stored if not immediately used and put on the market.

The composition obtained can be applied in the usual way by rolling, spraying, curtain-spraying, brushing, blading, if necessary after thickening.

The liquid film, however applied, is subjected to fast heating to evaporate the aqueous phase and produce the coalescence and afterwards is crosslinked by irradiation with UV-lamps.

In some cases the heat of the lamps used for the crosslinking is sufficient to obtain the coalescence of the liquid film.

In the following examples all the parts are in weight if not otherwise specified.

The substaces used in the examples are available on the market under the following trading names:
  ESACURE (F.lli Lamberti Spa)
  SARTOMER (Sartomer Co. USA)
  PROXEL (ICI)
  RHODOPOL (Rhône-Poulenc)
  LAROMER (BASF)
  IRGACURE (Ciba-Geigy)
  DAROCURE (Merck)
  QUANTACURE (Ward Blekinsop)
  NEOREZ (PolyvinylChemie)
  ACRONAL (Rohm & Haas)
  TEXANOL (Kodak)
  PRESANTIL (F.lli Lamberti)
  ESAPAL (F.lli Lamberti Spa)

EXAMPLE 1

To 65 parts of ESACURE KIP [75% of oligo-(4-alpha-hydroxyisobutirryl)-alpha-methyl-styrene in diacrylated tripropylen-glycol] are added at 75° C. 2 parts of nonylphenol condensed with 3 moles of ethylene oxide and 1 part of nonylphenol condensed with 9 moles of ethylene oxide, 0.2 parts of nonylphenol condensed with 100 moles of ethylene oxide, 1 part of N-methyldiethanolamine and 0.1 part of dodecyl alcohol condensed with 225 moles of ethylene oxide.

To the homogeneous solution are added 50 parts of water and 10 parts of polyethyleneglycol 400 diacrylated (SARTOMER SR 344). The suspension is grinded for 10 minutes in a colloidal mill Ultraturrax cooling from 75° C. to 30° C. At the end are added under agitation 0.4 parts of PROXEL GXL (ICI) and 13 parts of an aqueous solution 2.27% in weight of RHODOPOL 23.

The dispersion obtained contains 34% in weight of alphahydroxyketonic oligomeric photoinitiator and has the following characteristics:
  Appearance: Liquid dispersion, viscous, homogeneous, white
  Viscosity: 2300 mPas at 20° C. (Brookfield RVT 20 rpm)
  Stability: Stable for more than 4 months at 40° C.

EXAMPLE 2

To 65 parts of ESACURE KB1 (Benzyl-dimethylketal) are added at 75° C. 1 part of nonylphenol condensed with 9 moles of ethylene oxide, 2 parts of nonylphenol condensed with 3 moles of ethylene oxide, 1 part of of sulphated sodium salt of nonylphenol condensed with 30 moles of ethylene oxide, 1 part of 2-ethyl-hexanoic acid. To the homogeneous solution are added under agitation 100 parts of deionized water and the mixture is grinded for 10 minutes in Ultraturrax cooling to 35° C. At the end are added under agitation 0.4 parts of PROXEL GXL (ICI) and 8 parts of an aqueous solution 2.27% by weight of RHODOPOL 23.

The dispersion obtained contains 34.5% by weight of benzyldimethylketal and has the following characteristics:
  Appearance: Dispersion having pastous consistency, homogeneous, white color.
  Viscosity: 5000 mPas at 20° C. (Brookfield RVT 20 rpm)
  Stability: Stable for more than 4 months at 40° C.

EXAMPLE 3

To 94.5 parts of ESACURE TZT (80 parts of 2,4,6-trimethylbenzophenone and 20 parts of methylbenzophenone) are added 1.5 parts of ESAPAL NP 90 (nonylphenol condensed with 9 moles of ethylene oxide), 0.75 parts of nonylphenol condensed with 100 moles of ethylene oxide, 0.3 parts of dodecyl-alcohol condensed with 225 moles of ethylene oxide and 6 parts of N-methyl-diethanolamine. To the homogeneous solution are added under agitation 95 parts of deionized water. The mixture is grinded for 10 minutes in a colloidal mill Ultraturrax without passing 35° C. At the end are added under agitation 0.75 parts of PROXEL GXL (ICI) and 19 parts of an aqueous solution 2.27% by weight of RHODOPOL 23.

The dispersion obtained contains 44% by weight of photoinitiator and has the following characteristics:
  Appearance: White, homogeneous, milky liquid
  Viscosity: 900–1000 mPas at 20° C. (Brookfield RVT 20 rpm)
  Stability: Stable for more than 4 months at 40° C.

EXAMPLE 4

The dispersion of benzophenone is obtained in an analogous manner as described in Example 3. The solution of the auxiliaries and the grinding in the colloidal mill Ultraturrax are performed at 60° C. The final characteristics of the dispersion are similar to those of the dispersion of the Example 3.

EXAMPLE 5

To 100 parts of LAROMER PE 55 W (acrylated polyester by BASF; pH 4.5–5, viscosity 1000 mPas, dispersion at 50% in water) are added the photoinitiators according to the quantities reported in TABLE 1 so that in all cases 1.5 parts of photoinitiatotor (100% active) on 100 parts of resin are present.

After agitation for 10 minutes, the composition is applied to a glass plate to a thickness of 100 micrometers. The plate is heated in oven at 100° C. for 10 minutes and after cooling to ambient temperature is irradiated by passing it at 20 m/min under an 80 W Hanovia 6512-A-431 lamp, distance from the lamp 10 cm, for so many times as necessary for obtaining a tack free surface. The following characteristics are reported:
  reactivity (number of passages for obtaining a tack free surface)
  film appearance
  film color
  film residual smell.

TABLE 1

| Photoinitiator | parts % on system | n. pass. | Appearance | Yellowing (ASTM D 1925) | Smell |
|---|---|---|---|---|---|
| I* | | | | | |
| Product of Example 2 | 4.5 | 1 | transp. | 12 | v. light |
| BDMK | 1.5 | 2 | transp. | 12 | v. light |
| Product of Example 1 | 4.4 | 1 | transp. | 8 | absent |
| ESACURE KIP (1) | 2.0 | 1 | transp. | 8 | absent |
| IRGACURE KIP 184 (2) | 1.5 | 3 | transp. | 8 | aromat. |
| DAROCURE 1173 (3) | 1.5 | 3 | transp. | 8 | absent |
| DAROCURE 953 (4) | 1.5 | 2 | transp. | 8 | absent |
| II* | | | | | |
| QUANTACURE QTX (5) | 1.5 | 2 | transp. | 18 | aminic |
| QUANTACURE BTC (6) | 1.5 | 3 | opaque | 12 | aminic |
| Product of Example 3 | 3.5 | 1 | opaque | 10 | absent |
| ESACURE TZT (7) | 1.5 | 2 | opaque | 10 | absent |
| Product of Example 4 | 3.5 | 1 | opaque | 10 | absent |
| BZO | 1.5 | 3 | opaque | 10 | absent |

*Photoinitiator by homolitic cleavage (fragmentation)
**Photoinitiator by hydrogen extraction. In each formulation are added also 1.5 parts of N-methyldiethanolamine for 100 parts of system
(1) oligo (4-alpha-2-hydroxyisobutirryl)-alpha methylstyrene. 75% in tripropyleneglycol diacrylate (Lamberti)
(2) 1-benzoylcyclohexanol (Ciba-Geigy)
(3) 2-hydroxy-2-methylpropiophenone (Merck)
(4) 2-hydroxy-2-methyl-1-(p-dodecyl) propiophenone (Merck)
(5) 2-hydroxy-3-(3,4-dimethyl-9-oxo-9H-tioxanthen-2-yloxy)-N,N,N-trimethyl-1-propanechloride (Ward Blekinsop)
(6) 4-benzoyl-benzyl-N-trimethyl chloride (Ward Blenkinsop) (photoinitiator soluble in water)
(7) 80% 2,4,6-Trimethylbenzophenone/20% methylbenzophenone (Lamberti)
BDMK: Benzyldimethylketal
BZO: benzophenone The example shows that the dispersed photoinitiators prepared as described in the examples 1-4 are all very active and do not present side disadvantage. ESACURE KIP is very active. The others photoinitiators of Group II are very yellowing and not compatible (QUANTACURE QTX and BTC) or slightly active (BZO).

EXAMPLE 6

To 100 g of NEOREZ KT 18C (aliphatic acrylated polyurethane as aqueous dispersion 38%, pH 7, viscosity: 26 mPas) are added various amounts of the photoinitiators indicated in Table 2 (in order to have 1.5 parts of photoinitiator, at 100% of active, for 100 parts of resin in each preparation) and the mixture is stirred (60 rpm with impeller) for a fixed time, after that a film to a thickness of 200 micrometers (wet) is applied to a glass plate.

The plate is dried at 110° C. for 5 minutes or for 20 minutes and is irradiated under an 80 W Hanovia 6512-A-431 lamp at 15 m/min. by two passages at 10 cm from the lamp.

The resistence to MEK (number of double rubs) on crosslinked films is measured.

TABLE 2

| Photoinitiator | Parts % on System | 1 | 2 | 5 | 20 | 20 Dry. (min) 5 Stir. (min) |
|---|---|---|---|---|---|---|
| I* | | | | | | |
| Product of Example 1 | 4.4 | 90 | >200 | 180 | 180 | 178 |
| ESACURE KIP | 2.0 | 70 | 133 | 155 | 155 | 160 |
| IRGACURE 184 | 1.5 | 30 | 40 | 25 | 30 | 77 |
| DAROCURE 1173 | 1.5 | 40 | 40 | 40 | 40 | 40 |
| Product of Example 2 | 4.5 | 164 | 130 | 190 | 185 | 185 |
| BDMK | 1.5 | 18 | 17 | 26 | 28 | 35 |
| II** | | | | | | |
| Product of Example 3 | 3.5 | 50 | 75 | 85 | 85 | 83 |
| ESACURE TZT | 1.5 | 30 | 62 | 76 | 75 | 78 |
| Product of Example 4 | 3.5 | 48 | 70 | 82 | 80 | 81 |
| BZO | 1.5 | 25 | 60 | 75 | 72 | 72 |

*Photoinitiator by homolitic cleavage (fragmentation)
**Photoinitiator by hydrogen extraction. In each formulation are added also 1.5 parts of N-methyldiethanolamine for 100 parts of system.

The example shows that, given the same concentration, the photoinitiators as aqueous dispersion impart to the photopolymerisable system an higher photochemical reactivity, in respect to those normally available on the market. It is also demonstrated that, even after long mixing times, the normal photoinitiators are not suitable for use in these systems, while with the aqueous dispersions of photoinitiators already after few minutes of agitation interesting properties are obtained. Even after longer drying times the normal photoinitiators do not impart to the films the wanted reactivity.

EXAMPLE 7

To 100 g of LAROMER PE 55 W (BASF, see example 5) are added various quantity of the photoinitiators indicated in TABLE 3 and the mixture is subjected to mechanical agitation (80 rpm, impeller) for 1,2 and 5 minutes. The dispersion is applied on glass to a thickness of 200 micrometers (wet) and dried in oven at 120° C. for 7 minutes.

After cooling it is irradiated under an 80 W Hanovia 6512-A-431 lamp at 20 m/min at 10 cm from the lamp.

The reactivity (number of passages for obtaining a tack free surface) (see Table 3) and film hardness (at the maximum dosage of luminous energy received) according to the method of Koënig's Pendulum (DIN 53157) in seconds (see Table 4) are measured.

The results reported in Table 3 show that, given the same concentration, the aqueous dispersed photoinitiators impart to the photopolymerisable system an higher reactivity in respect of the commercially available photoinitiators, independently from agitation time in the preparation of the mixtures. That means that the dispersions according to the present invention are highly compatible and easily included with a minimum of agitation. In this case also ESACURE KIP is very active since already diluted in diacrylated tripropylenglycol which promotes the dispersion.

The results reported in Table 4 show that for the photoinitiators in aqueous dispersion the films hardness is higher than that obtained using the corresponding pure photoinitiators (with the only exception of ESACURE KIP for the reasons given in the above mentioned table). In so far as the compounds of group I are concerned, the hardness with the pure products is lower even after longer irradiation times (3 passages instead of 2).

The same behaviour is noticed with the photoinitiators of group II, although, as it can be expected for the hydrogen extraction systems, the hardness is inferior than that measured with the photoinitiators by fragmentation.

TABLE 3

| Photoinitiator | parts % on system | number of passages for a tack-free surface | | |
|---|---|---|---|---|
| | | agitation (min) | | |
| | | 1 | 2 | 5 |
| I* | | | | |
| Product of Example 1 | 4.4 | 1 | 1 | 1 |
| ESACURE KIP | 2.0 | 2 | 1 | 1 |
| IRGACURE 184 | 1.5 | 3 | 2 | 2 |
| DAROCURE 173 | 1.5 | 3 | 2 | 3 |
| Product of Example 2 | 4.5 | 1 | 1 | 1 |
| BDMK | 1.5 | 3 | 2 | 2 |
| II** | | | | |
| Product of Example 3 | 3.5 | 1 | 1 | 1 |
| ESACURE TZT | 1.5 | 3 | 3 | 2 |
| Product of Exmple 4 | 3.5 | 1 | 1 | 1 |
| BZO | 1.5 | 5 | 5 | 4 |

*Photoinitiator by homolitic cleavage (fragmentation)
**Photoinitiator by hydrogen extraction. In each formulation are added also 1.5 parts of N-methyldiethanolamine for 100 parts of system.

TABLE 4

| Photoinitiator | Parts % on system | Number of passages | Hardness (Koenig's pendulum) (sec) | | |
|---|---|---|---|---|---|
| | | | Agitation (min) | | |
| | | | 1 | 2 | 5 |
| Product of Example 1 | 4.4 | 2 | 27 | 27 | 31 |
| ESACURE KIP | 2.0 | 2 | 27 | 28 | 27 |
| IRGACURE 184 | 1.5 | 3 | 21 | 23 | 28 |
| DAROCURE 173 | 1.5 | 3 | 11 | 18 | 25 |
| I$_a$* | | | | | |
| Product of Example 2 | 4.5 | 2 | 22 | 22 | 29 |
| BDMK | 1.5 | 2 | 22 | 22 | 29 |
| II** | | | | | |
| Product of Example 3 | 3.5 | 3 | 18 | 19 | 19 |
| ESACURE TZT | 1.5 | 3 | 15 | 16 | 16 |
| II$_a$** | | | | | |
| Product of Example 4 | 3.5 | 5 | 11 | 11 | 11 |
| BZO | 1.5 | 5 | 9 | 9 | 9 |

*Photoinitiator by homolitic cleavage (fragmentation)
**Photoinitiator by hydrogen extraction. In each formulation are added also 1.5 parts of N-methyldiethanolamine for 100 parts of system

EXAMPLE 8

A water-paint for mural application is prepared by dispersing with a turbomixer "Molteni" (500 rpm) the following compounds in the given order (all the parts are by weight):

| Base | | |
|---|---|---|
| Water | parts | 21.2 |
| Sodium Hexametaphosphate | parts | 1 |
| Acrylic disperdent | parts | 0.2 |
| Antifoam | parts | 0.1 |
| Rutile titanium bioxide | parts | 15 |
| Calcium carbonate | parts | 15 |
| Talc | parts | 4 |
| ACRONAL 290 P (Rhom-Haas) | parts | 35 |
| PRESANTIL (Antiflash rusting) | parts | 0.7 |
| Diurethane thickener (20% in water) | parts | 1 |
| Ethylene glycol | parts | 1 |
| Coalescence agent (Texanol-Kodak) | parts | 0.5 |
| Antifoam | parts | 0.2 |
| Acrylic thickener | parts | 2.4 |
| Ammonia 28 Be | parts | 0.3 |

The formulation is completed by adding under mild agitation for 5 minutes (60 rpm) the other components.

| Finished | | |
|---|---|---|
| Base | parts | 10 |
| LAROMER PE 55 w | parts | 0.95 |
| Product of example 1 | parts | 0.045 |

The base and the finished are applied on an asbestos cement panel to a thickness of 250 micrometers (wet).

The film is dryed in darkness and then exposed to the sun light for 3 days in order that the absorbed energy is 3.5 J/cm$^2$ at 340 nm.

The valuations are reported in Table 5.

TABLE 5

| Characteristic | Base | Finished |
|---|---|---|
| Film appearance | polished compact | polished compact |
| Water repellency (Spray test) | totally wettable | impermeable |
| Water resistance (100 double rubs) | matted | unchanged |
| MEK resistance (100 double rubs) | matted | unchanged |
| Stain resistance (suspension Fe$_2$O$_3$) | brown | colourless |
| Resistance to 2 double bending | unchanged | unchanged |

The results show that the photoinitiators in aqueous disperse systems of the present invention can be advantageously used in the resin dispersions (water-paint) for the building industry (or similar) to impart better properties to the coatings.

It has been noticed that films containing the photopolymerisable thanks to the spread crosslinking without losing in flexibility.

EXAMPLE 9

To a wood-lacquer, consisting of 36.5 parts of acrylated polyester and 6.5 parts of rutile titanium bioxide dispersed in 57 parts of water, are added 4.3 parts of a dispersion of photoinitiator (I) according to Example 1 (PID A) but containing also 4.3 parts of 2,4,6-trimethyl-benzoyl-diphenyl-phosphine oxide for 100 parts of PID A (PID A+APO). After agitation for 5 minutes and degasing for 4 hours the lacquer is applied to a thickness of 200 micrometers (wet), the water is evaporated for 10 minutes at 65° C. and the resulting film is irradiated with a 80 W IST lamp (distance from the lamp 29 cm) at 3 m/min by three passages. After 4 hours the properties reported in Table 6 are measured and compared with the properties of films obtained by introducing the photoinitiators (II):

TABLE 6

| Phot. | | Parts % on system | Parts % phot. resin | Hard. Koenig (sec) | Mek (doub. rubs) | Appea. | Resist. nail-scratch |
|---|---|---|---|---|---|---|---|
| (I) | PID A + APO | 4.3 | — | — | — | — | — |
| | KIP | — | 4 | 45 | >300 | White polis. | Total |
| | APO | — | 0.5 | — | — | — | — |
| (II) | KIP | 2 | 4 | — | — | — | — |
| | APO | 0.18 | 0.5 | 22 | 180 | White | Scratch rough surface grains |

The example shows that it is possible to obtain a total crosslinking also in the depth of strongly pigmented films prepared from aqueous disperse systems using dispersed photoinitiators, while using commercially available products the properties obtained are not useful for practical use.

EXAMPLE 10

In this example are compared the properties of films obtained from two photocrosslinkable compositions containing the same photoinitiator (ESACURE KIP) and the same oligomer (ROSKYDAL 850 w-acrylated autoemulsifying polyester-Bayer) but differing in so far as the diluent is concerned.

In one case the diluent is water (emulsified composition) in the other case is hexadiolacrylate (reactive diluent monomer, HDDA). The liquid mixtures are applied to glass in order to obtain crosslinked films to a thickness of 100 micrometers, after evaporation of water in oven at 100° C. for 10 minutes and crosslinking through irradiation with a 80 W Hanovia 6512-A-431 lamp (distance from the lamp 10 cm) (2 passages).

On the crosslinked film are evaluated: hardness (Koenig's pendulum DIN 53157), residual smell, weight lost and the extract in diethyl ether, as reported in Table 7.

The example shows that an emulsified system permits to obtain characteristics similar to those of photocrosslinkable systems diluted in a reactive solvent but permits also to avoid the presence of smell and residual monomer in the crosslinked films.

TABLE 7

| Components (mixed according to the given order) | A | B |
|---|---|---|
| 1. ROSKYDAL 850 w | 100 | 60 |
| 2. HDDA | — | 40 |
| 3. ESACURE KIP | — | 2 |
| 4. Water | 60 | — |
| 5. Product of example 1 | 4.4 | — |
| Applied thickness wet (nanometer) | 160 | 100 |
| Hardness (Koenig) (sec) | 60 | 65 |
| Smell (1) | absent | strong |
| Weight loss at 120° C. | 0.05% | 2.5% |
| Extract in diethyl ether | absent | 2.7% (2) |

(1) The residual smell is totally independent from the photoinitiator which, being oligomer, gives no photolytical fragments volatile or smelling.
(2) The infrared spectroscopy analysis shows that the extracted is prevalently HDDA.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. An aqueous dispersion system of photoinitiators comprising at least one photoinitiator and at least one surface active agent, wherein the photoinitiator represents from 20% to 80% by weight and the surface active agent from 0.1% to 10% by weight of the dispersion system.

2. The aqueous dispersion system of photoinitiators according to claim 1, wherein the photoinitiator represents from 30% to 60% by weight of the dispersion system and the surface active agent from 0.5% to 2% by weight of the dispersion system.

3. The aqueous dispersion system according to claim 1, wherein the photoinitiator is a compound selected from the group consisting of benzoine ethers, benzyl-dimethyl-ketal, 2,2-di-alkoxyacetophenones, alpha-hydroxy-alkyl-aryl ketones, arylglyoxylic acids esters, mono- and di-acyl-phosphine oxides, aromatic ketones, tioxanthones, antraquinones hexa-aryl-bis-imidazoles and mixtures thereof.

4. The aqueous dispersion system of photoinitiators according to claim 1, wherein the photoinitiator is coupled with a hydrogen donor (coinitiator), the weight ratio between the photoinitiator and the hydrogen donor is between 1:1 and 1:2.5.

5. The aqueous dispersion system of photoinitiators according to claim 1, wherein the photoinitiator is benzophenone or its alkyl derivative.

6. The aqueous dispersion system of photoinitiators according to claim 1, wherein the photoinitiator is coupled with a hydrogen donor (coinitiator), said hydrogen donor being a compound containing a tertiary amino group with at least a hydrogen atom on the carbon atom linked to the nitrogen of the amino group.

7. The aqueous dispersion system of photoinitiators according to claim 1, wherein the photoinitiator is coupled with a hydrogen donor (coinitiator), said hydrogen donor being a compound selected from the group consisting of N-methyl-N,N-diethanolamine (MDEA), triethanolamine, and p-dimethylamino-benzoic acid esters.

8. The aqueous dispersion system of photoinitiators according to claim 1, wherein the surface active agent is selected from the group consisting of organic sulphonic acids and their salts, monoalkyl sulphates, quaternary ammonium salts, higher aliphatic alcohols or alkylphenols condensed with ethylene oxide and/or propylene, partial esters of phosphoric acid with aliphatic alcohols and their salts.

9. An aqueous dispersion of photoinitiators comprising at least one photoinitiator typically used in non-aqueous photopolymerizable systems and at least one surface active agent, wherein the photoinitiator represents from 20% to 80% by weight and the surface active agent from 0.1% to 10% by weight of the dispersion system.

* * * * *